(12) United States Patent
Bougher et al.

(10) Patent No.: US 11,375,639 B2
(45) Date of Patent: Jun. 28, 2022

(54) ADDITIVE MANUFACTURED MULTI-LAYER THERMALLY CONDUCTIVE PARTS

(71) Applicants: Thomas Lloyd Bougher, Atlanta, GA (US); Matthew Kirby Smith, Atlanta, GA (US)

(72) Inventors: Thomas Lloyd Bougher, Atlanta, GA (US); Matthew Kirby Smith, Atlanta, GA (US)

(73) Assignee: TCPOLY INC., Atlanta, GA (US)

( * ) Notice: Subject to any disclaimer, the term of this patent is extended or adjusted under 35 U.S.C. 154(b) by 292 days.

(21) Appl. No.: 16/430,033

(22) Filed: Jun. 3, 2019

(65) Prior Publication Data

US 2019/0373773 A1 Dec. 5, 2019

Related U.S. Application Data

(60) Provisional application No. 62/679,899, filed on Jun. 3, 2018.

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/20* | (2006.01) | |
| *B29C 64/106* | (2017.01) | |
| *G06F 1/20* | (2006.01) | |

(52) U.S. Cl.
CPC ....... *H05K 7/20409* (2013.01); *B29C 64/106* (2017.08); *G06F 1/206* (2013.01)

(58) Field of Classification Search
CPC .......... H05K 7/20409; H05K 7/20418; H05K 7/2039; G06F 1/206
See application file for complete search history.

(56) References Cited

U.S. PATENT DOCUMENTS

| | | | |
|---|---|---|---|
| 5,057,903 A | 10/1991 | Olla | |
| 5,168,926 A | 12/1992 | Watson | |
| 5,737,187 A * | 4/1998 | Nguyen | .................. G06F 1/203 165/185 |
| 6,432,511 B1 | 8/2002 | Davis | |
| 7,440,282 B2 * | 10/2008 | Brandenburg | ...... H01L 23/3675 165/185 |
| 7,737,463 B2 | 6/2010 | Lee | |
| 8,030,818 B2 | 10/2011 | Nelson | |
| 2004/0188814 A1 | 9/2004 | Houle | |
| 2004/0190253 A1 * | 9/2004 | Prasher | .................... G06F 1/203 361/699 |
| 2015/0216088 A1 * | 7/2015 | Kawai | ................ H05K 7/20409 361/710 |
| 2018/0042101 A1 * | 2/2018 | Avalos | ............... H05K 7/20854 |

* cited by examiner

*Primary Examiner* — Anthony M Haughton
(74) *Attorney, Agent, or Firm* — Lempia Summerfield Katz LLC

(57) ABSTRACT

A thermal management device includes a single contiguous component. The single contiguous component includes a first portion made of a first thermally conductive plastic, and a second portion extending away from the first portion. The second portion is made of a second thermally conductive plastic. The second thermally conductive plastic is different than the first thermally conductive plastic. The second portion has a greater hardness than the first portion.

16 Claims, 12 Drawing Sheets ns, electrical conductivity, elastic modulus, thermal conductivity, radiative emission and absorption, EMI/RFI shielding properties, another physical property, or any combination thereof.

ADDITIVE MANUFACTURED MULTI-LAYER THERMALLY CONDUCTIVE PARTS

PRIORITY

This application claims the benefit of U.S. Provisional Application No. 62/679,899, filed Jun. 3, 2018, which is hereby incorporated by reference in its entirety.

BACKGROUND

A problem in creating efficient electronics packaging for thermal management is joining heat transfer components (e.g., heat sinks, heat spreaders, heat pipes) to heat sources (e.g., processors, LEDs, power electronics, batteries). Because surfaces of the heat sources are not perfectly smooth and planar, efficient thermal contact is not provided without the use of an interposer layer (e.g., a thermal interface material (TIM)).

Two common types of TIMs are thermal greases and gap pads. Thermal greases are messy and difficult to apply, and gap pads often suffer from low thermal conductivity and thus add thermal resistance to the system. For non-planar heat sources (e.g., cylindrical batteries), the joining of inner and outer surfaces using a TIM is difficult. The TIM adds to manufacturing complexity and cost.

A contact between a heat source (e.g., a heat generating component) and the TIM, as well as a contact between the TIM and the heat transfer component may create a large thermal resistance that impedes heat flow and raises a temperature of the heat generating component being cooled. A further increase in thermal resistance may be caused by incorrect installation of the TIM during assembly that reduces a contact area between the heat source and the heat transfer component.

Heat sink manufacturers may pre-install a TIM by attaching one side of the TIM (e.g., a gap pad or thermal tape) to the heat sink, while applying an adhesive tape to the other side of the TIM for removal upon installation. The TIM may also be attached using a thermally conductive epoxy or other adhesive TIMs. While this may be helpful for final package assembly, this adds thermal resistance and cost to the packaging.

Further problems may be caused by the heat generating electronic components being electrically isolating from the heat dissipating components. The majority of materials that conduct heat well also conduct electricity (e.g., metals, carbons, semi-conductors).

SUMMARY AND DESCRIPTION

The scope of the present invention is defined solely by the appended claims and is not affected to any degree by the statements within this summary.

In order to decrease thermal resistance within an electronics packaging and decrease cost in manufacturing the electronics packaging, a thermal management device is three-dimensionally (3D) printed with at least two different thermally conductive plastic materials. The thermal management device includes an interface that is 3D printed with a first material of the at least two different thermally conductive plastic materials, and a body that is 3D printed with a second material of the at least two different thermally conductive plastic materials. The interface is attachable to a heat source within the electronics packaging. There is a distinct difference in the relevant physical properties of the two different thermally conductive plastic materials, where the first material differs from the second material in hardness, electrical conductivity, elastic modulus, thermal conductivity, radiative emission and absorption, EMI/RFI shielding properties, another physical property, or any combination thereof.

In a first aspect, a thermal management device includes a single contiguous component. The single contiguous component includes a first portion made of a first thermally conductive plastic and a second portion extending away from the first portion. The second portion is made of a second thermally conductive plastic. The second thermally conductive plastic is different than the first thermally conductive plastic. The second portion has a greater hardness than the first portion.

In a second aspect, an electronic device includes a heat generating component and a heat sink that is a single contiguous component. The single contiguous component includes a first portion made of a first thermally conductive plastic and a second portion made of a second thermally conductive plastic. The first portion abuts the heat generating component. The second portion includes fins extending away from the first portion. The second thermally conductive plastic is different than the first thermally conductive plastic. The first portion has a hardness of less than 95 A, and the second portion has a hardness of greater than 95 A.

In a third aspect, a method of manufacturing a thermal management device is provided. The thermal management device includes a single contiguous component. The method includes forming a first portion. The forming of the first portion includes three-dimensionally (3D) printing the first portion using a first thermally conductive plastic. The method also includes forming a second portion on the first portion. The forming of the second portion includes 3D printing the second portion on the first portion using a second thermally conductive plastic. The second thermally conductive plastic is different than the first thermally conductive plastic. The second portion has a greater hardness than the first portion.

BRIEF DESCRIPTION OF THE DRAWINGS

For a more complete understanding of the disclosure, reference is made to the following detailed description and accompanying drawing figures, in which like reference numerals may be used to identify like elements in the figures.

Figure 1:
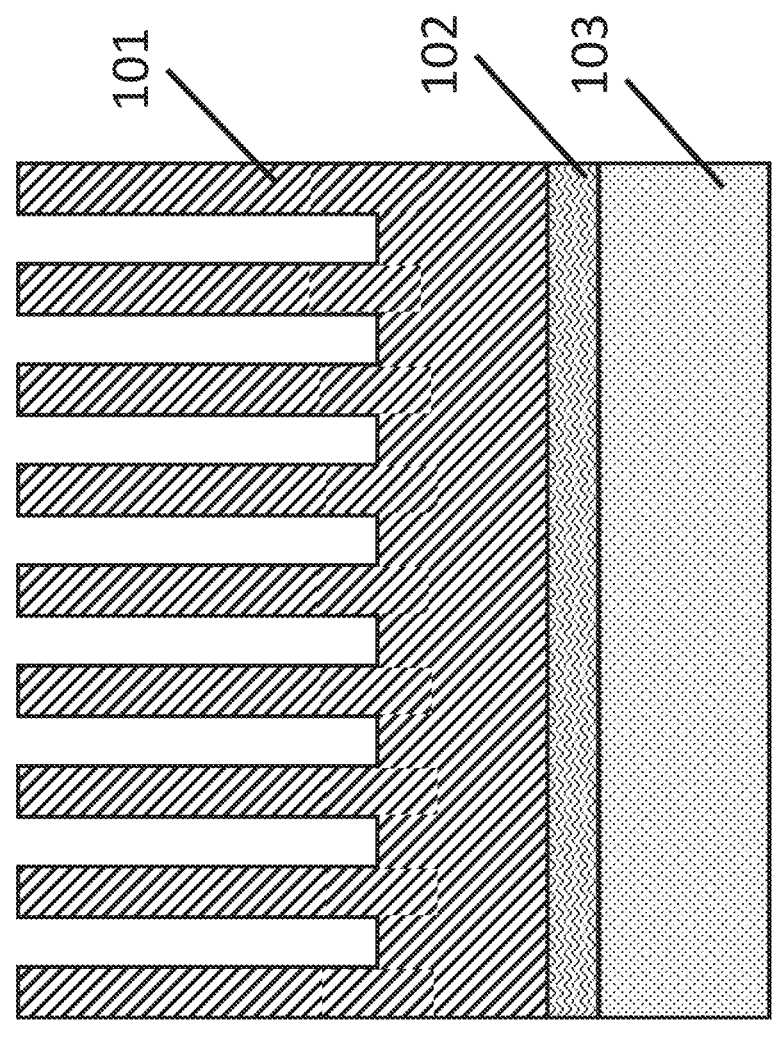
FIG. 1 shows one embodiment of a thermally conductive plastic heat sink.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

In order to reduce manufacturing complexity and cost, a thermal interface material (TIM) for physically and thermally connecting a heat transfer component to a heat generating component is removed. Thermally conductive plastics may be tuned in hardness to accommodate rough surfaces and make good contact. Heat transfer components at least partially made of thermally conductive plastics having thermal conductivity values of, for example, 5-40 W/m-K (e.g., a thermal conductivity value in a direction for a print line as measured by laser flash (ASTM E1461) may be efficient heat transfer components. A single soft plastic (e.g., a hardness <90 A) may not be used for the entire heat generating component, however, since the elastic modulus of the soft material is not sufficient to create structural features or high aspect ratio fins.

Thermally conductive plastics are often used in electronics applications due to design flexibility through molding and relatively high thermal conductivity. Thermally conductive plastics generally describe a wide range of polymer composites where one or more thermally conductive fillers are mixed into a polymer matrix to enhance thermal conductivity. Bulk polymers generally have a thermal conductivity of 0.1-0.5 W/m-K, but with the inclusion of thermally conductive filler particles, the final material may have a thermal conductivity greater than 5 W/m-K.

Thermally conductive plastics may be used not only for electronics housings, but for heat transfer parts such as cold plates and heat sinks. Battery packs for electrical vehicles are another application where the ability to make complex shapes is beneficial for both the integration of the batteries and also liquid cooling channels. Thermally conductive plastics may not be suitable for the highest heat flux applications, but thermally conductive plastics may be used for applications where having more integrated parts, reducing weight, corrosion resistance, and cutting cost are important. For example, an electronics package that previously included a standard plastic case and a metal heat sink may be replaced with a single thermally conductive part forming both the structural case and the heat sink.

In one or more of the present embodiments, a single part (e.g., a heat transfer component) is formed with multiple plastics. For example, the heat transfer component includes a first portion and a second portion. The first portion includes a layer of a first material at an interface (e.g., with a heat generating component), and the second portion includes a second material used for the bulk of the part. The second material is harder than the first material. The first material and the second material are of a same polymer family and may thus be seamlessly integrated with strong adhesion between the first material and the second material.

The heat transfer component, for example, may be electrically isolated from the heat generating component to which the heat transfer component is attached. There are very few additives available to use in a thermally conductive plastic that enable high thermal conductivity, and often, these materials may be either expensive (e.g., boron nitride) or abrasive (e.g., aluminum nitride). To minimize the use of an electrically insulating thermally conductive material, the interface may be a thin layer of an electrically insulating (e.g., resistivity $>10^9$ Ω-cm or $>10^9$ Ω-cm) thermally conductive plastic to achieve proper electrical isolation, and the bulk of the heat transfer component may be made of electrically non-insulating (e.g., resistivity $<10^8$ Ω-cm or $<10^9$ Ω-cm) thermally conductive plastic that may have lower cost, higher thermal conductivity, and/or better melt processing (e.g., non-abrasive).

The connecting of the first portion and the second portion of the heat transfer component may be difficult using traditional molding techniques. Additive manufacturing, however, is well-suited for incorporating different material compositions on different layers of a same part. For example, using fused deposition modeling (FDM) 3D printing, layers of molten thermoplastic may be deposited on top of each other with fine control. Other methods of additive manufacturing that allow for composite plastic parts including, for example, selective layer sintering (SLS), stereolithography (SLA), digital light projection (DLP), or any other process involving melting and reforming thermoplastics or curing thermoset plastics in an additive manner may be used. Many FDM printers offer multiple extruder nozzles, so that switching the material being printed is a seamless process during manufacturing. The result is a single part (e.g., the first portion and the second portion), all made of the same base plastic but with slightly different chemistry or fillers to enable different regions of the part to have different properties (e.g., hardness, electrical conductivity, or thermal conductivity). While using the same polymer matrix for different regions of the part is beneficial from a layer adhesion standpoint, this is not necessary. Any two polymers that adhere well together may be used as the matrix materials.

A benefit of integrating multiple materials into the same part is the ability to incorporate electrically insulating materials near sensitive electronics, while using electrically conductive materials for the remainder of the part. Often, electrically insulating, thermally conductive plastics are more expensive and have a lower thermal conductivity compared to electrically conductive, thermally conductive plastics. By selectively using the electrically insulating material and making the remainder from the electrically conductive material, the overall part may have a higher thermal conductivity and lower cost. An integrated part made of multiple materials may use both hard and soft materials, as well as electrically insulating and electrically conductive materials. For example, in a battery casing, the material surrounding a cylindrical battery can be both soft and electrically insulating, while the remainder of the casing may be hard and electrically conductive. Other material properties such as, for example, UV resistance, vapor transmission rate, electromagnetic transparency, temperature stability may be provided for different portions of a single contiguous component depending on the application.

FIG. 1 shows one embodiment of a thermally conductive plastic heat sink 100 that is joined to a heat source 103. FIG. 1 shows one heat source 103, but the thermally conductive plastic heat sink 100 may be joined to any number of heat sources 103. The thermally conductive plastic has two distinct regions. The two distinct regions include an interfacial region or layer 102 (e.g., a first region, the first portion) made up of a soft thermally conductive material (e.g., hardness <95 A) that is in direct contact with the heat source 103 and is compliant to make good thermal contact to conduct heat from the heat source 103. The material making up the interfacial layer 102 is thermally conductive and may be either electrically conducting or electrically insulating. The two distinct regions also include second region 101 (e.g., the main portion, the second portion). The second region 101 is a main structure of the heat sink 100 including a base and any number of heat fins. The second region 101 is also thermally conducting. In one example, the main portion 101 of the heat sink 100 is made up of a thermally conductive plastic with a hardness >95 A. The main portion 101 of the heat sink 100 may be made from a thermally conductive electrically insulating or electrically conducting thermoplastic.

In one example, the interfacial region 102 is formed by a thermally conductive material that is, by weight, 40% Graphite flakes and 60% 70 A TPU, which results in a material with a hardness of 88 A and a thermal conductivity of 7 W/m-K; the main portion 101 is formed by a thermally conductive material that is, by weight, 40% Graphite flakes and 60% 95 A TPU, which results in a material with a hardness of 100 A and a thermal conductivity of 7 W/m-K. Other polymer matrices and/or fillers, and/or different weight percentages may be provided. For example, the main portion 101 is formed by a thermally conductive material that is, by weight, 35% Graphite flakes and 65% polycarbonate, which results in a material with a hardness of 60 D and a thermal conductivity of 5 W/m-K.

In another example, the interfacial region 102 is formed by a thermally conductive material that is, by weight, 40% Graphite flakes and 60% 70 A TPU, which results in an electrically insulating material that is RF transparent, with a resistivity >$10^{12}$ Ω-cm; the main portion 101 is formed by a thermally conductive material that is, by weight, 40% Graphite flakes and 60% 95 A TPU, which results in an electrically conducting material that is RF absorbing, with a resistivity <$10^5$ Ω-cm and a thermal conductivity of 7 W/m-K. Other polymer matrices and/or fillers, and/or different weight percentages may be provided. For example, the interfacial region 102 is formed by a thermally conductive material that is, by weight, 40% Graphite flakes and 60% Nylon, which results in an electrically insulating material that is RF transparent, with a resistivity >$10^{12}$ Ω-cm and a thermal conductivity of 4 W/m-K; the main portion 101 is formed by a thermally conductive material that is, by weight, 35% carbon fiber and 65% Nylon, which results in an electrically conducting material that is RF absorbing, with a resistivity <$10^6$ Ω-cm and a thermal conductivity of 5 W/m-K. As yet another example, the interfacial region 102 is formed by a thermally conductive material that is, by weight, 40% Boron nitride flakes and 60% 70 A TPU, which results in a soft electrically insulating material that is RF transparent, with a resistivity >$10^{12}$ Ω-cm, a thermal conductivity of 4 W/m-K, and a hardness of 90 A; the main portion 101 is formed by a thermally conductive material that is, by weight, 40% Graphite flakes and 60% 95 A TPU, which results in a hard electrically conducting material that is RF absorbing, with a resistivity <$10^5$ Ω-cm, a thermal conductivity of 7 W/m-K, and a hardness of 100 A.

Figure 2:
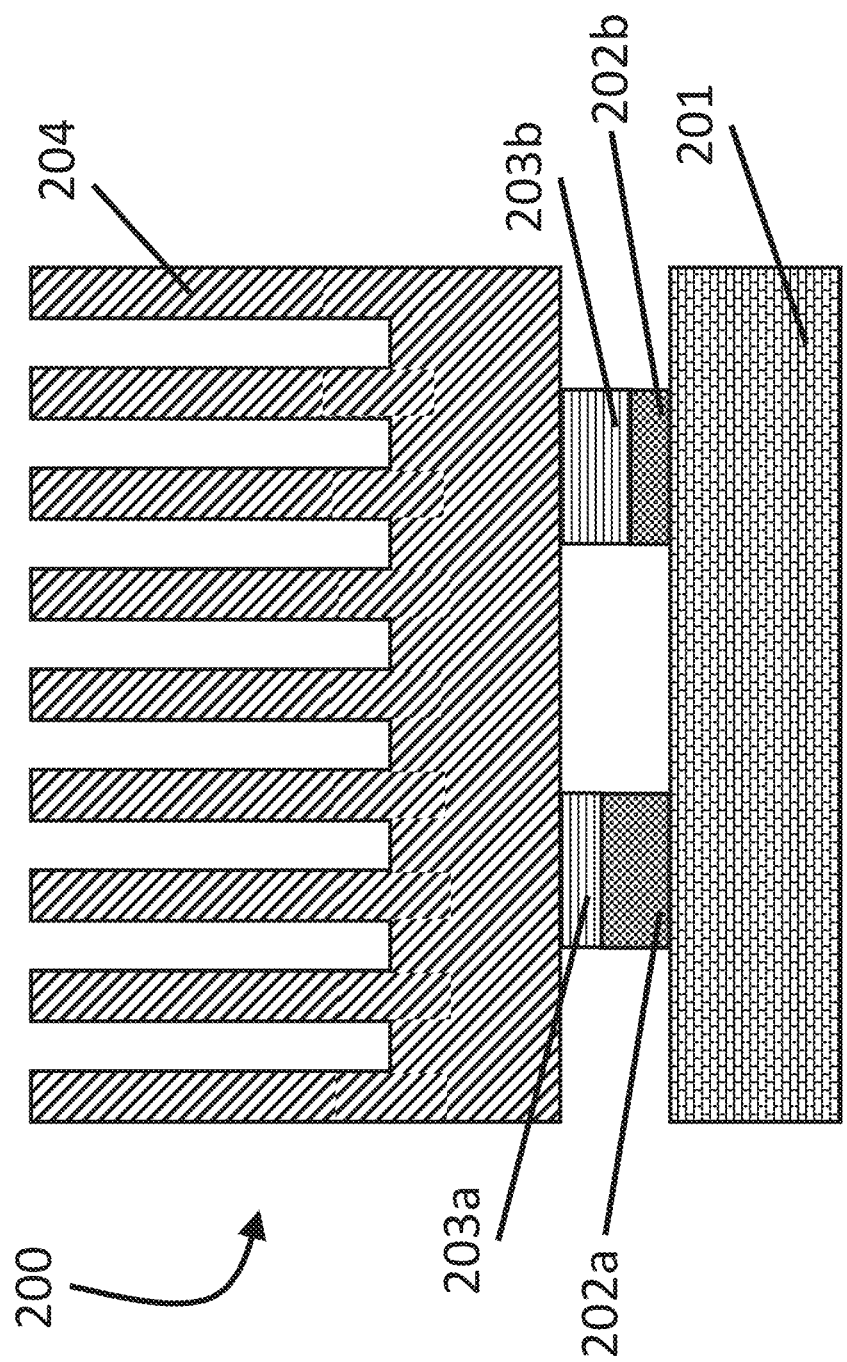
FIG. 2 shows one embodiment of an electronic device including a thermally conductive plastic heat sink.

FIG. 2 shows one embodiment of an electronic device including a heat sink 200 that is made of a thermally conductive plastic multi-material. The heat sink 200 is connected to an electronic circuit board 201 with, for example, two heat generating electronic chips 202a, 202b of different heights, respectively. Other embodiments may include more, fewer, and/or different (e.g., with different heights) heat generating electronic chips 202. The two heat generating electronic chips 202a, 202b are connected to the heat sink 200 through interfacial layers 203a, 203b, respectively, that are soft and thermally conductive. Embodiments with more, fewer, and/or different heat generating electronic chips 202 may include more, fewer, and/or different interfacial layers.

The two interfacial layers 203a, 203b have different overall thicknesses to accommodate the different chip heights. The interfacial layers 203a, 203b are directly connected to a main portion 204 of the heat sink 200, during the manufacturing process when the layers of one region (e.g., the main portion, the second portion) are printed directly on top of the layers of the other region (e.g., the interfacial layers 203, 203b, the first portion and a third portion). Either the main portion 204 of the heat sink 200 or the interfacial layers 203a, 203b may be printed first depending upon the print orientation during manufacturing. Either method will sufficiently bond the two regions together to create a unified part. The interfacial layers 203a, 203b are made of a soft thermally conductive material (e.g., thermal conductivity >2 W/m-K, hardness <95 A) that may be either electrically conducting or electrically insulating. In one embodiment, the interfacial layer 203b is made of a different material than the interfacial layer 203a. For example, the interfacial layer 203b includes a different thermally conductive filler than the interfacial layer 203a. The main portion 204 of the heat sink 200 is made of a thermally conductive plastic (e.g., thermal conductivity >2 W/m-K) and may be electrically insulating or electrically conducting. If the heat sink 200 is part of a larger structural component, then the hardness may be >95 A. If the heat sink 200 is standalone, the material may be soft as well.

Figure 3:
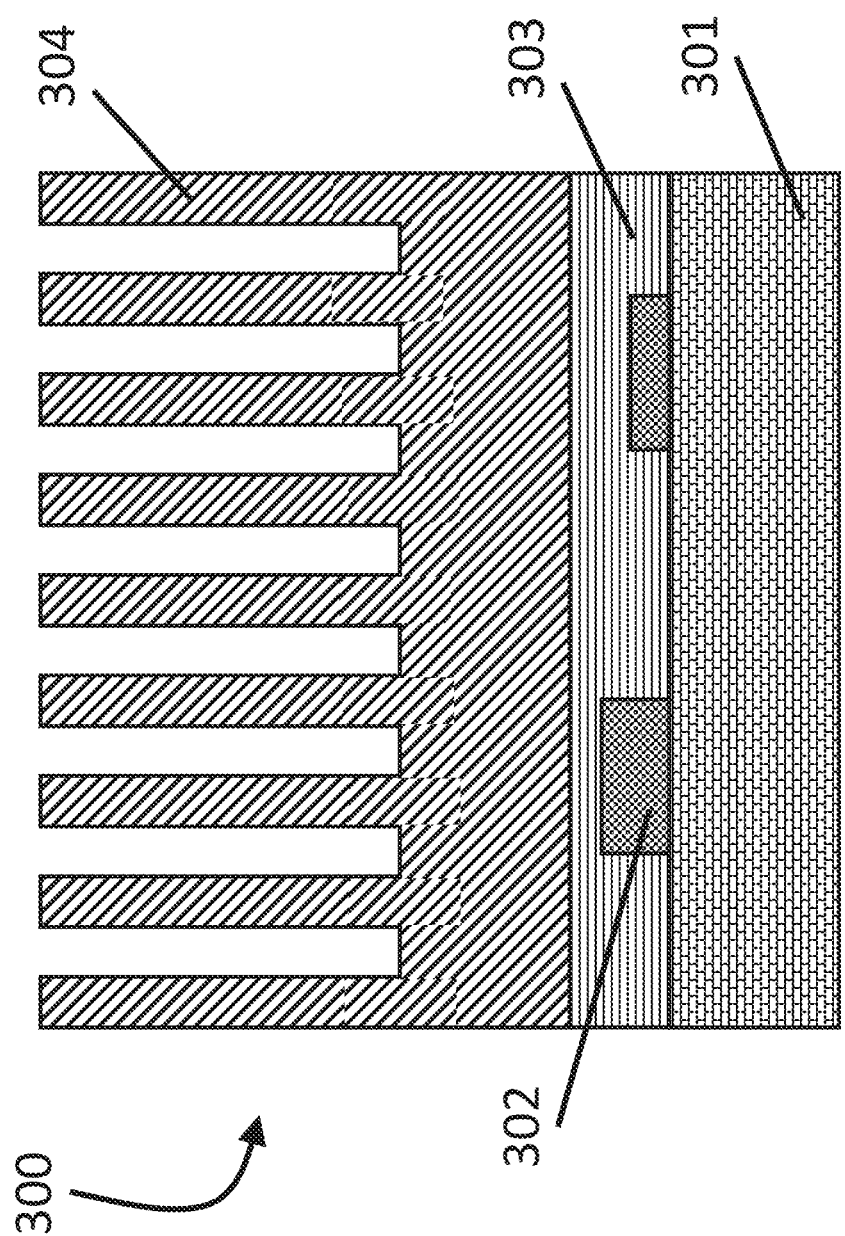
FIG. 3 shows one embodiment of an electronic device including a thermally conductive plastic heat sink.

FIG. 3 shows an embodiment of a heat sink 300 that is made of a thermally conductive plastic multi-material. The heat sink 300 is connected to an electronic circuit board 301 with two heat generating electronic chips 302a, 302b of different heights. The electronic circuit board 301 may include more or fewer heat generating electronic chips 302 with the same or different heights. The two heat generating electronic chips 302a, 302b are connected to the heat sink 300 through interfacial layers 303 (e.g., the first portion) that are soft and thermally conductive. The interfacial layers 303 are printed directly on top of the circuit board 301 such that an entire top of the circuit board 301 is covered be the material of the interfacial layers 303 with various heights to accommodate the different features on the circuit board 301. The interfacial layers 303 are directly connected to a main portion 304 (e.g., the second portion) of the heat sink 300 during the manufacturing process when, for example, layers of the main portion material are printed directly on top of the interfacial layers 303. In this manufacturing method, the circuit board 301 is placed on the print bed and printed over with the interfacial layers 303, with the main portion 304 printed on top of the interfacial layers 303. By printing over the circuit board 301 with the interfacial layers 303, all surfaces of the heat generating electronic chips 302 may be covered (e.g., abutted, surrounded) by the interfacial layers 303 except surfaces of the heat generating electronic chips 302, respectively, abutting the circuit board 301 (e.g., bottom surfaces of the heat generating electronic chips 302). This manufacturing method will sufficiently bond the main portion 304 and the interfacial layers 303 together to create a unified part. The interfacial layers 303 are made of a soft thermally conductive material (e.g., thermal conductivity >2 W/m-K, hardness <95 A) that are electrically insulating (e.g., resistivity >$10^9$ Ω-cm or >$10^9$ Ω-cm) to prevent current leakage from the circuit board 301. In one embodiment, the first portion 303 is made of a thermally conductive plastic having a dielectric constant below five, and the second portion is made of a thermally conductive plastic having a dielectric constant above seven.

Figure 4:
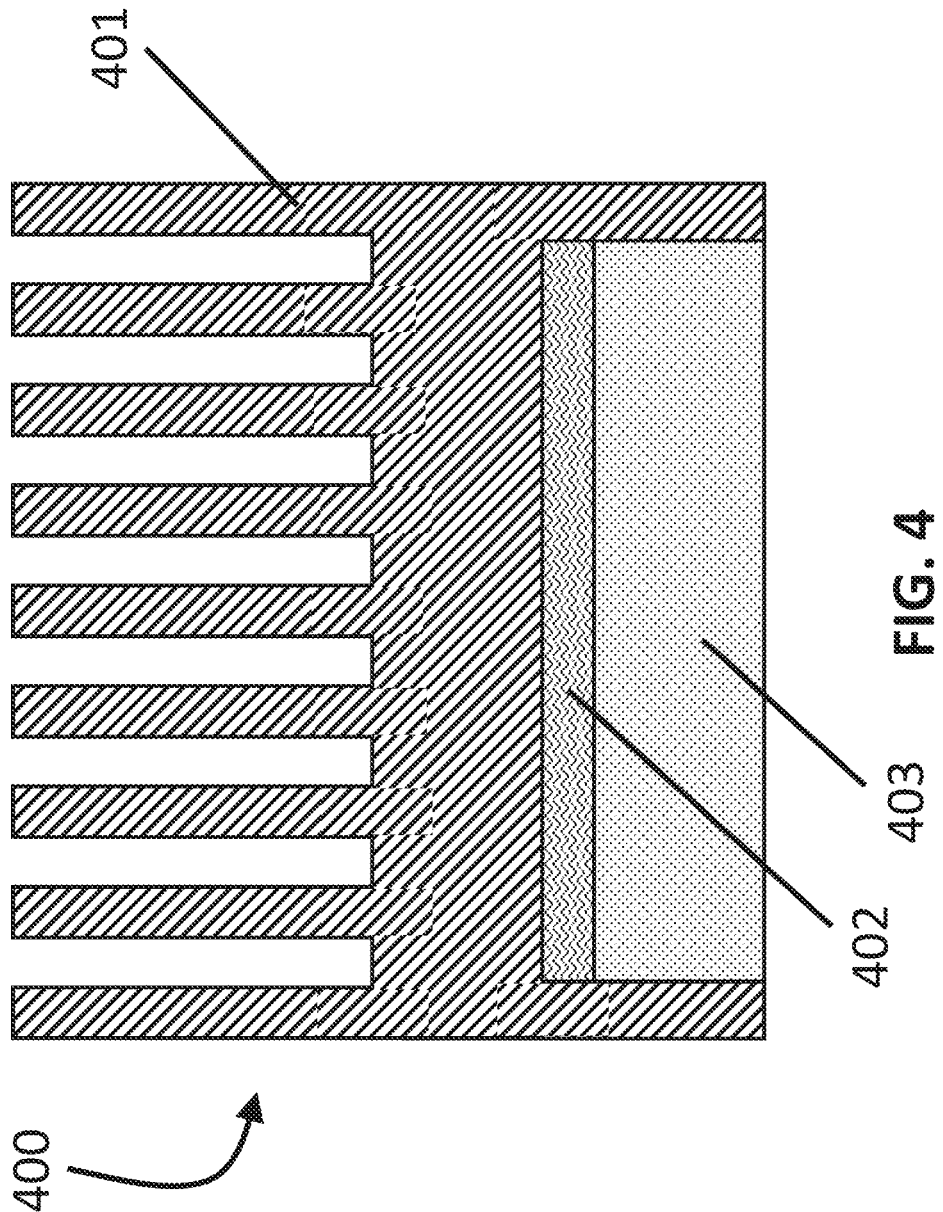
FIG. 4 shows one embodiment of a thermally conductive plastic heat sink.

FIG. 4 shows one embodiment of a thermally conductive plastic heat sink 400 that is joined to a heat source 403. The heat source 403 may be any number of different types of heat sources including, for example, an electronics chip. The thermally conductive plastic has two distinct regions. The two distinct regions include an interfacial region or layer 402 (e.g., a first region, the first portion) made up of a soft thermally conductive material (e.g., hardness <95 A) that is in direct contact with the heat source 403. The interfacial layer 402 is compliant to make good thermal contact, to conduct heat from the heat source 403. The material making up the interfacial layer 402 is thermally conductive and is also electrically insulating. The two distinct regions also include a second region 401 (e.g., the main portion, the second portion). The second region 401 is a main structure of the heat sink 400 including a base and any number of heat fins. The second region 401 is also thermally conducting and absorbs electromagnetic radiation. The second region 401 extends down around the interfacial layer 402 as well as around the heat source 403 such that electromagnetic radiation received by the heat source 403 is minimized or the emitted radiation from the heat source 403 is prevented from propagating to other nearby electronics and causing interference. In such a case, the second region 401 acts as an electromagnetic radio frequency interference (EMI/RFI) shield. For example, the a thermally conductive plastic of the first region 402 is configured (e.g., based on the polymer matrix and/or the filler) to be transparent to electromagnetic waves over at least a particular range of frequencies (e.g., relevant to electronic devices of a computing device), and a thermally conductive plastic of the second region 401 is configured (e.g., based on the polymer matrix and/or the filler) to absorb electromagnetic energy at a range of wavelengths (e.g., relevant to electronic devices of the computing device), such that electromagnetic interference/radio frequency interference shielding is provided.

Figure 5:
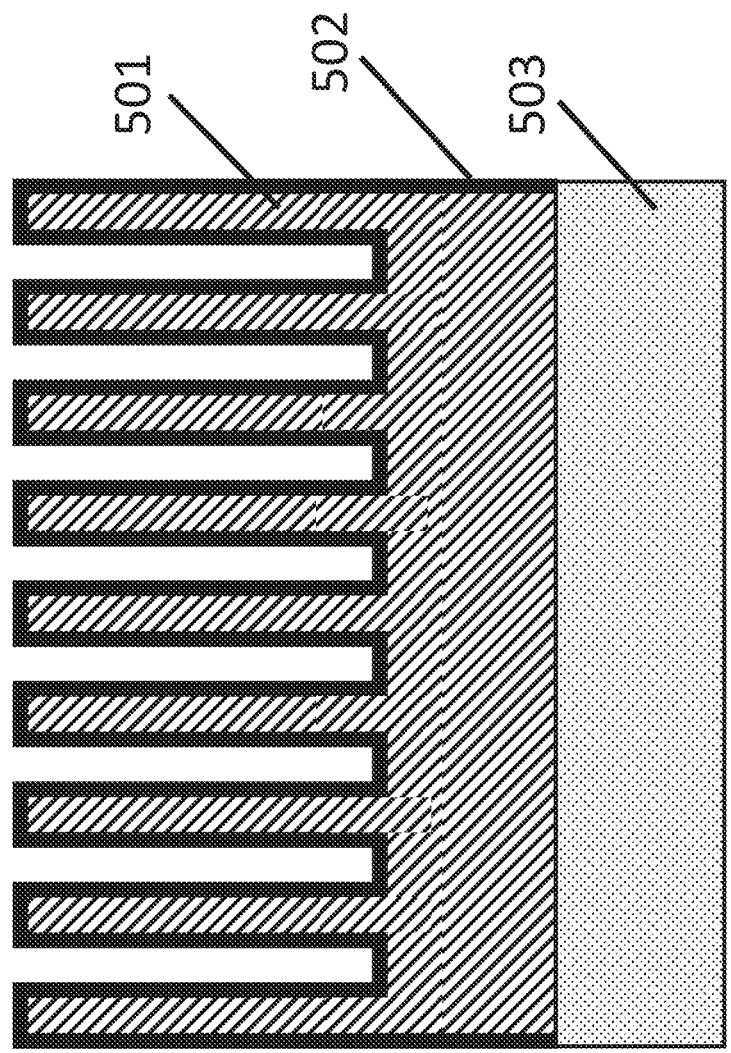
FIG. 5 shows one embodiment of a thermally conductive plastic heat sink.

FIG. 5 shows one embodiment of a heat sink 500 that is made of a thermally conductive plastic and is joined to a heat source 503. The thermally conductive plastic has at least two distinct regions. The two distinct regions include an outer layer 502 (e.g., a first region, the first portion) made up of a thermally conductive plastic. The two distinct regions also include a second region 501 (e.g., a body, a main portion, the second portion). The second region 501 is a main structure of the heat sink 500 including a base and any number of heat fins. The second region 501 is also thermally conducting. The thermally conductive plastic may include more distinct regions. For example, the thermal conductive plastic may include a third region that acts as an interfacial layer abutting the heat source 503. The second region 501 may have a hardness greater than the third region acting as the interfacial layer.

The outer layer 502 at least partially covers the main portion 501. For example, the outer layer 502 covers all outermost portions of the main portion 501 other than a surface of the main portion 501 that abuts the heat source 503 (e.g., a bottom surface).

The first region 502 has different emissive or absorptive properties compared with the second region 501. In one example, the main portion 501 of the heat sink 500 strongly absorbs light from the solar spectrum, while the outer first region 502 does not. For outdoor applications, this prevents the heat sink 500 from absorbing solar radiation and raising the temperature of the heat sink 500 and the heat source 503. In such an example the absorptivity of the outer first region 502 is below 0.2 over the wavelength range of 400 to 1200 nm, and the absorptivity of the second region 501 is greater than 0.5 within the range of 400 to 1200 nm. Other absorptivities may be provided. In another example the first portion 502 has high emissivity in the mid infrared region (e.g., a wavelength of 10 μm), while the second portion 501 does not have a high emissivity in this region. In this example, the first portion 502 has an emissivity greater than 0.7 in the wavelength range of 5 to 10 μm, while the main region 501 has an emissivity below 0.5 in the wavelength range of 5 to 10 μm. This allows the heat sink to dissipate heat more effectively through radiation.

In one example, the first region 502 is formed by a high infrared emissivity material that is, by weight, 45% Graphite flakes and 55% Polypropylene, which results in a material with emissivity of above 0.7 between 5 and 10 μm, and a thermal conductivity of 9 W/m-K; the second region 501 is formed by a low infrared emissivity material that is, by weight, 45% Boron nitride flakes and 55% Polypropylene, which results in a material with emissivity of below 0.3 between 5 and 10 μm, and a thermal conductivity of 6 W/m-K. Other combinations may be provided.

Figure 6:
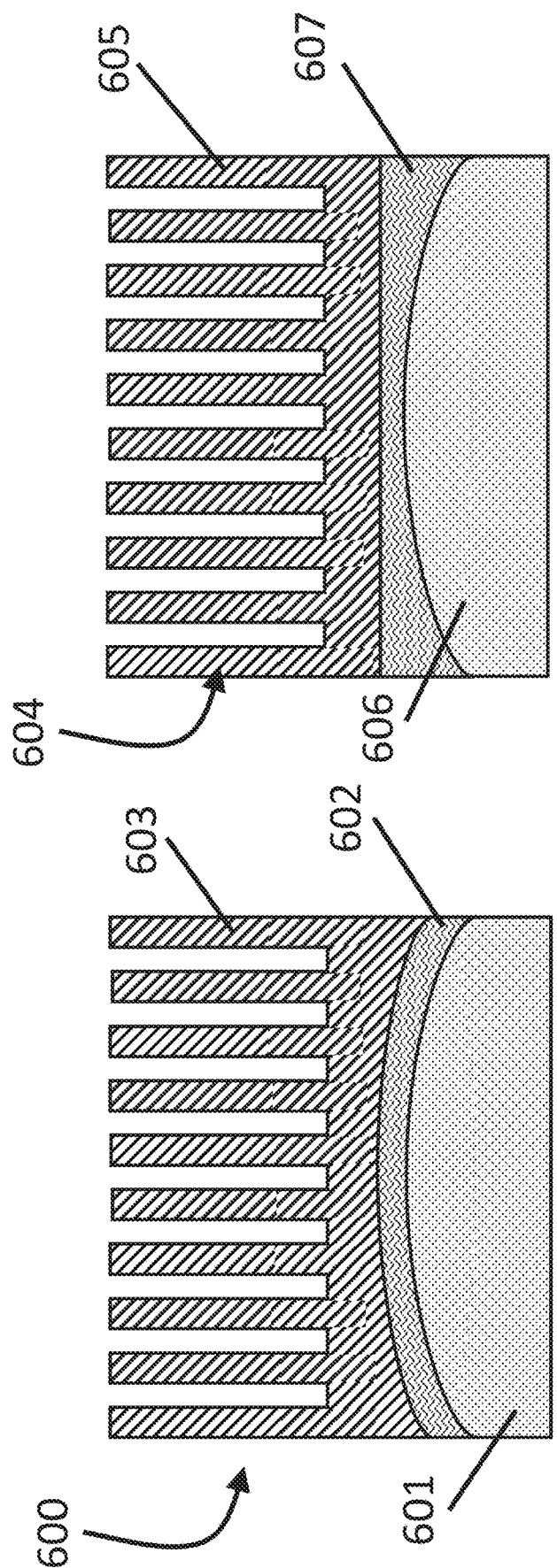
FIG. 6a shows one embodiment of a flexible thermally conductive heat sink.
FIG. 6b shows electronics packaging including a standard metal heat sink connected to a non-planar heat source using a thick gap pad.

FIG. 6a shows a first embodiment of a heat sink 600 that may flex to accommodate a non-planar surface 601 that generates heat using an interfacial layer 602 (e.g., a thin interfacial layer). The heat sink 600 may be 3D printed and may be made of a thermally conductive plastic material. The heat sink 600 is semi-flexible and may achieve very thin features while still being flexible. A thin flexible 3D printed heat sink may easily conform to a large surface that is non-planar (e.g., a bow where a center is 0.3 mm higher than edges). A very thin interfacial layer (e.g., 0.1-0.2 mm) may still be used to conform to a surface with a change in height greater than a total thickness of the interfacial layer 602, since the heat sink 600 itself bends to accommodate the curvature of the heat source surface 601. This allows the use of very thin interfacial layers 602, which if free standing, may be weak mechanically or break apart. However, when the interfacial layer 602 is integrated into the heat sink 600, the combined part 600 has adequate mechanical properties and does not suffer the same problems as a standalone thin TIM. For contrast, FIG. 6b also shows electronic packaging 604 including a standard metal heat sink 605 connected to a non-planar heat source 606 using a thick gap pad 607. The gap pad 607 TIM is much thicker than the embodiment of the heat sink 600 (e.g., on the order of 1 mm to accommodate thickness variation of 0.3 mm over the heat sink 605).

The heat sink including the thermally conductive plastic with the integrated thermal interface material has the benefits of being lightweight, corrosion resistant, lower cost, and may have the advantage of higher thermal performance compared to a metal heat sink attached with a separate TIM. A heat sink, for example, with a fully integrated thermal interface material not only reduces the total number of components required, but may reduce the thermal resistance by eliminating an interface between a TIM and the heat sink.

In one embodiment, during manufacturing of a heat sink with an integrated thermal interface material, the heat sink is continuously manufactured (e.g., 3D printed) such that one or more layers of the first material (e.g., an interface material that is soft compared to the second material and thermally conductive) are printed, and thereafter (e.g., immediately), layers of the second material (e.g., a thermally conductive material that is hard compared to the first material) are 3D printed on top of the one or more layers of the soft thermally conductive interface material.

The material on a print bed of the 3D printer is still hot, and when a molten layer of plastic is extruded from a nozzle of the 3D printer, the molten layer is deposited on top of the material on the print bed. The conditions during printing are such that the newly deposited layer of molten plastic locally melts an underlying layer on the print bed, and an interface melt bonds together with polymer chains from the layer of molten plastic and the underlying layer on the print bed becoming intermingled. This creates a strong and intimate contact.

At an interface between the interface material and the thermally conductive material, the intermingling of the respective polymer chains minimizes a thermal resistance at a transition from the interface material to the thermally conductive material (e.g., used for a body of the heat sink). This also eliminates the need for an adhesive to join the interface material and another thermally conductive material.

In one embodiment, the interface material is soft enough to compress (e.g., elastically) by 10-30% of a thickness of the one or more layers of the interface material for contact with an opposing surface (e.g., the heat source). The harder thermally conductive material is stiffer than the interface material and is used to print the body and fins of the heat sink. The interface material and the harder thermally conductive material are both thermally conductive (e.g., through the use of thermally conductive fillers, continuous fiber, or aligned polymer chains). Different or the same fillers may be used in the first portion (e.g., a thermal interface) and the second portion (e.g., the body and the fins) of the heat sink.

Adhesion between different layers of, for example, the part (e.g., heat sink) is dictated by interactions of the polymer matrices and is not significantly affected by using different filler types or amounts of fillers in the first portion and the second portion of the part. In one embodiment, the polymer matrix used for the first portion of the part is derived from a same polymer chemistry as the polymer matrix used for the second portion of the part. The elastic modulus, hardness, and other mechanical properties of a polymer may change with a polymer chain length. When two polymers with a same polymer backbone have a different chain length, a composition with a shorter chain length may have a lower elastic modulus and hardness. A composition with a longer chain length may have a higher elastic modulus and hardness. The two polymers have same monomer units but possess at least one different bulk thermomechanical property.

In other embodiments, two polymers of different chemical composition may be used for the first portion and the second portion of the part, respectively. There are some polymers that may not be tuned to a very soft composition and would be unsuitable for use as the interface material but may have other advantageous properties that make the polymers attractive for use as the bulk of the part (e.g., the second portion of the part). In this case a different polymer matrix may be used for the interface material and the bulk of the part so long as interfacial adhesion between the polymers of the interface material and the bulk of the part is sufficient to create a strong cohesive part without the use of additional adhesives or fasteners.

If different polymers are to be used, melt processing temperatures for the different polymers may be similar (e.g., within approximately 30° C.) so that one polymer is not completely solidified or overly melted when a new layer is deposited upon an existing layer during the printing process. In some cases, screws, clamps or other fasteners may be used to attach the heat sink to the heat source, for example, with the interface material (e.g., the first portion of the part) in direct contact with the heat source. In such cases, the fasteners may be tightened to compress the interface material for improved contact between the heat source and the interface material contact, but fasteners are not required to keep the first portion and the second portion of the part together since the first portion of the part and the second portion of the part are strongly joined during the manufacturing process.

Figure 7:
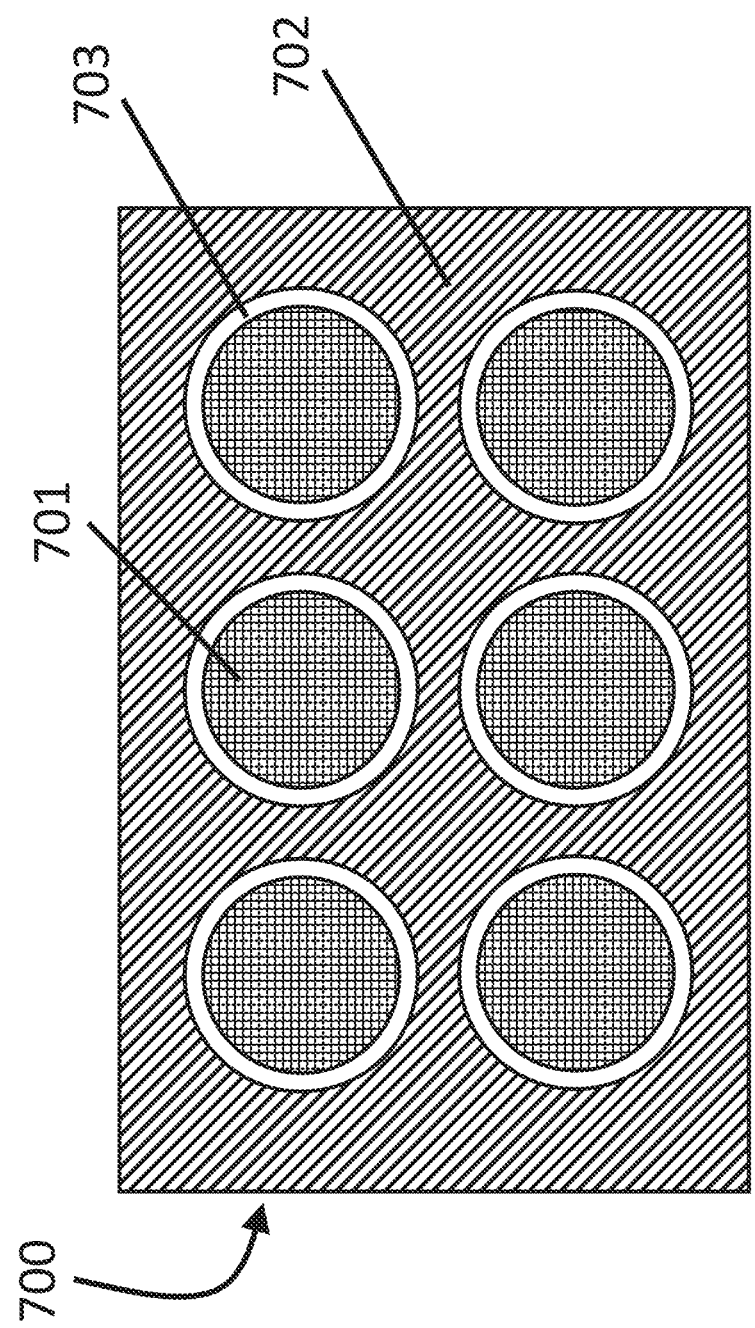
FIG. 7 shown one embodiment of an electric battery module.

FIG. 7 shows an electric battery module 700 (e.g., a battery pack) that holds batteries 701 (e.g., cylindrical batteries). The electric battery module 700 is, for example, a battery housing. The electric battery module 700 conducts heat away from the batteries 701 during operation. In this example, there are six cylindrical batteries 701 in the electric battery module 700, but there may be any number of batteries 701. The electric battery module 700 includes a main battery module structure 702 that is made from thermally conductive plastic. The thermally conductive plastic is, for example, non-electrically insulating (e.g., volume resistivity $<10^9$ $\Omega$-cm as measured by ASTM D257). The thermally conductive plastic may be non-electrically insulating to increase the thermal conductivity of the material or reduce the cost. The electric battery module 700 also includes an interfacial layer 703 (e.g., a thin layer) of soft thermally conductive plastic surrounding the batteries 703 to provide compliance for good thermal contact and provide electrical isolation from the main structure 702 of the battery electric battery module 700. The soft interfacial layer 703 is, for example, between 0.5 and 3 mm thick and has a thermal conductivity >2 W/m-K and an electrical volume resistivity $>10^9$ $\Omega$-cm. Different thicknesses, thermal conductivities, and/or electrical volume resistivities may be provided. Using FDM printing, for example, the two portions (e.g., the interfacial layers 703 and the main structure 702) of the electric battery module 700 are built up layer by layer. In one example, two different heated nozzles switch back and forth to print the two different materials. In one example, the two materials are made using the same thermoplastic matrix material so that the layers are strongly bonded together when the molten polymer layers are deposited.

Figure 8:
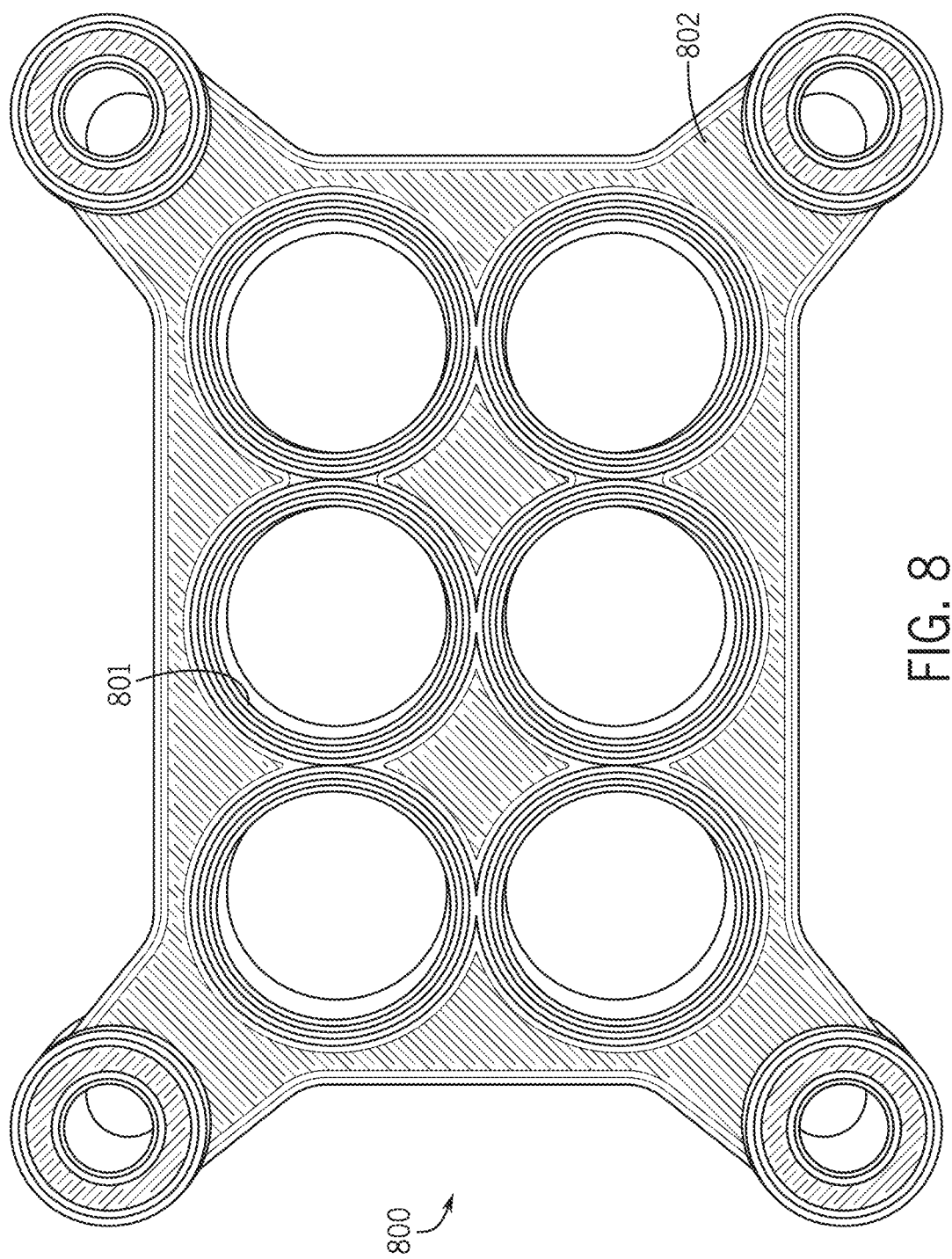
FIG. 8 shows one embodiment of an electric battery module.

FIG. 8 shows an electric battery module 800 (e.g., a battery pack) that holds batteries (e.g., cylindrical batteries). The electric battery module 800 is, for example, a battery housing. The electric battery module 800 conducts heat away from the batteries 801 during operation. The electric battery module 800 includes a main battery module structure 802 that is made from thermally conductive plastic. The thermally conductive plastic is, for example, non-electrically insulating (e.g., volume resistivity $<10^9$ $\Omega$-cm). The thermally conductive plastic may be non-electrically insulating to increase the thermal conductivity of the material or reduce the cost. The electric battery module 800 also includes an interfacial layer 801 (e.g., a thin layer) of soft thermally conductive plastic surrounding the batteries to provide compliance for good thermal contact and provide electrical isolation from the main structure 802 of the electric battery module 800. The soft interfacial layer 801 is between 0.5 and 3 mm thick and has a thermal conductivity >2 W/m-K and an electrical volume resistivity $>10^9$ $\Omega$-cm. Different thicknesses, thermal conductivities, and/or electrical volume resistivities may be provided. Using FDM printing, for example, the two portions (e.g., the interfacial layers 801 and the main structure 802) of the electric battery module 800 are built up layer by layer.

In one example, two different heated nozzles switch back and forth to print the two different materials. In one example, the two materials are made using the same thermoplastic matrix material so that the layers are strongly bonded together when the molten polymer layers are deposited. FIG. 8 shows the lines for the printer toolpath for each of the two materials to 3D print the two-material battery pack 800. In this example, the printer prints three rings of soft electrically insulating material around each battery housing, with the remainder of the battery pack 800 printed out of a harder, non-electrically insulating material.

Figure 9:
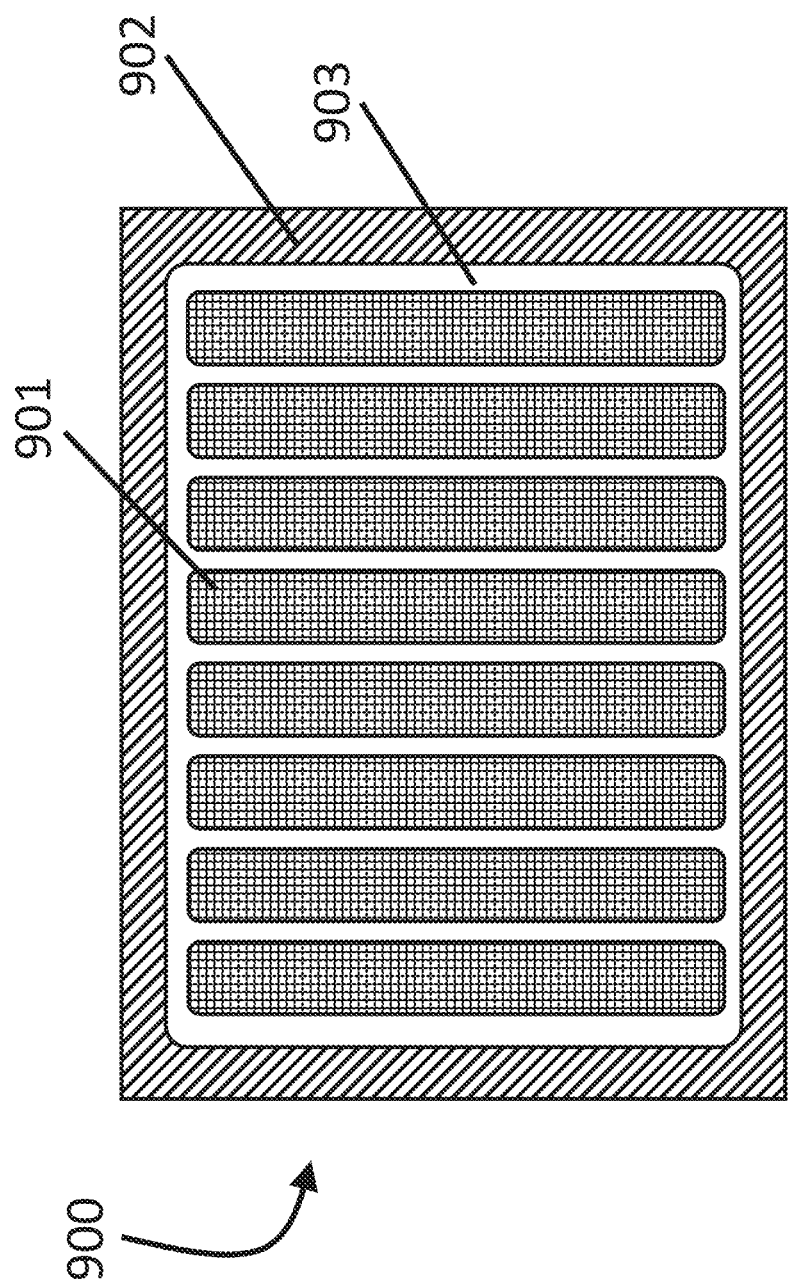
FIG. 9 shows one embodiment of an electric battery module.

FIG. 9 shows one embodiment of an electric battery module 900 (e.g., a battery pack) that holds prismatic batteries 901 and conducts heat away from the batteries 901 during operation. In this example, there are eight prismatic batteries 901 in the electric battery module 900, but there may be any number of batteries. The electric battery module 900 includes a main structure 902 (e.g., a main battery module structure) that is made from thermally conductive, non-electrically insulating plastic (e.g., volume resistivity <$10^9$ Ω-cm). The thermally conductive plastic may be non-electrically insulating to increase the thermal conductivity of the material or reduce the cost. The electric battery module 900 also includes an interfacial layer 903 (e.g., a thin layer) of soft thermally conductive plastic surrounding the batteries 901. The interfacial layers 903 provide compliance for good thermal contact and provide electrical isolation from the main structure 902 of the electric battery module 900. Each of the soft interfacial layers 903 may be, for example, between 0.5 and 3 mm thick and may have a thermal conductivity >2 W/m-K and an electrical resistivity >$10^9$ Ω-cm. Using FDM printing, the two portions of the electric battery module 900 (e.g., the main structure 902 and the interfacial layers 903) are built up layer by layer. Any number of layers may be built up to form the two portions of the electric battery module. For example, the number of layers built up to form the two portions of the electric battery may be based on a height of the prismatic batteries 901. In one example, two different heated nozzles switch back and forth to print the two different materials. In one example, the two materials are made using the same thermoplastic matrix material so that the layers are strongly bonded together when the molten polymer layers are deposited.

Keeping batteries from overheating (e.g., lithium ion batteries) is of importance in a range of electric motor applications, such as electric automotive vehicles. Currently, a range of techniques is used to prevent high operating temperatures in Li+ batteries, including thermally conductive molded/cured plastics and standard plastics with integrated cooling channels. A Li+ battery expands and contracts as the battery charges and discharges, making it difficult to maintain full contact with a wall of the battery to dissipate heat.

A thermally conductive plastic battery housing may be very versatile in design and high performance, and by including soft and electrically conducting layers around each battery, the performance of the battery module may be improved and the cost of the battery may be reduced. Typically, the highest performance thermally conductive plastics are also electrically conducting due to the types of filler particles used. Fillers that are electrically insulating are more expensive and have lower thermal conductivity. The batteries are to be electrically isolated, so this prevents making an entire module out of electrically conducting material. If the entire part is printed or molded out of thermally conductive plastic, the part is to be made out of the more expensive and lower thermal conductivity electrically insulating material. Instead, a 3D printed battery pack may have cylindrical sleeves (e.g., a 18650 style battery) around the batteries using electrically insulating material, while the remainder of the battery pack may be made out of the higher performance and lower cost electrically conducting material. In addition, the cylindrical sleeves around the batteries may be printed out of much softer material to create an interfacial layer capable of conforming to the battery wall and also maintaining contact while the batteries expand and contract. To maintain good electrical isolation and enough compliance, sleeves of 0.8 to 1.6 mm in thickness, for example, may be provided; this allows 2 to 4 print lines surrounding each battery. Other thicknesses and other numbers of print lines may be provided.

For certain battery packs, a third material region may be useful to create thermally insulating regions of the module. Li+ batteries may not operate below approximately 10° C., and for automotive applications, the ambient temperature may be well below this. To keep the batteries warmer during the initial operation, it may be desirable to limit the heat loss around a perimeter of the electric battery module. The electric battery module may have integrated fluid channels to remove the heat once the batteries get up to operating temperature. In one embodiment, a voltage may be applied to the electrically conducting portion of the battery pack, such that resistive heating is generated and the battery pack is warmed to an operating temperature.

Figure 10:
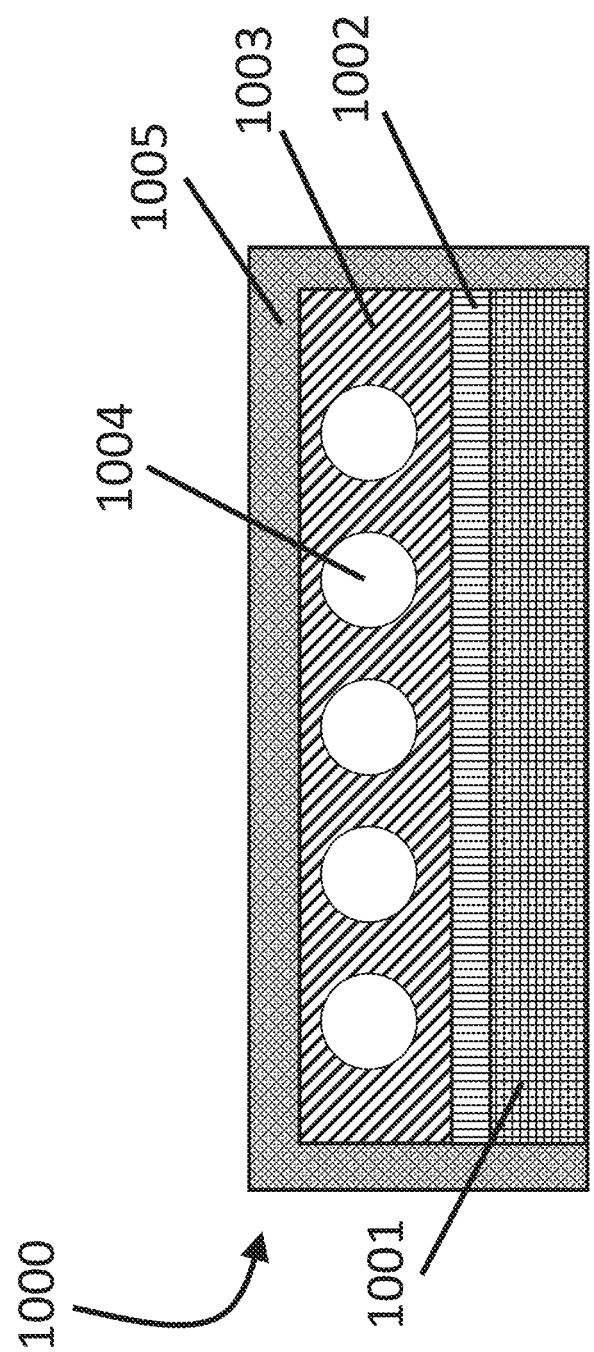
FIG. 10 shows one embodiment of a thermally conductive plastic cold plate.

FIG. 10 shows one embodiment of a cold plate 1000 made of thermally conductive plastic. The cold plate 1000 is manufactured through FDM printing. The cold plate 1000 includes an interfacial layer 1002 that is soft. The cold plate 1000 is connected to a heat source 1001 through the soft interfacial layer 1002. The cold plate 1000 also includes a body 1003 (e.g., a main structure, the second portion). The body 1003 is made of a thermally conductive plastic that is harder than the interfacial layer 1002. The body 1003 conducts heat into fluid cooling channels 1004. In one embodiment, one or more outer layers 1005 (e.g., an outer layer; a top and sides) of the cold plate 1000 is made from a thermally insulating plastic (e.g., thermal conductivity <1 W/m-K) to prevent heat from escaping the top of the cold plate 1000 to surrounding components. For example, the outer layer 1005 abuts a top and/or sides of the body 1003 and abuts sides of the heat source 1001 and the interfacial layer 1002, respectively. The thermally insulating layer 1005 may be used to prevent heat from the surroundings conducting into the heat source 1001 or to prevent heat from the heat source 1001 conducting to the surroundings. A single contiguous 3D printed component includes the soft interfacial layer 1002, the body 1003, and, for example, the outer layer 1005 of the cold plate 1000. Such an outer layer may be applied to a battery module of, for example, FIGS. 7-9.

Figure 11:
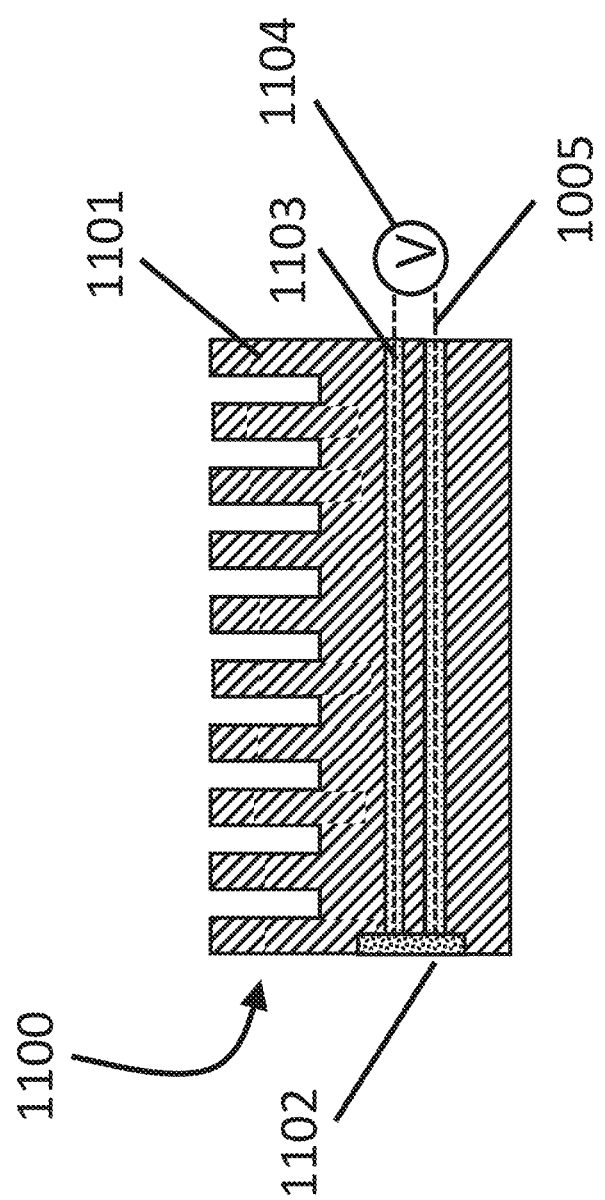
FIG. 11 shows one embodiment of a thermally conductive plastic heat sink with embedded electrical components and wires.

FIG. 11 shows one embodiment of a heat sink 1100 made of thermally conductive plastic. The heat sink 1100 includes an embedded electronics component 1102 (e.g. a LED chip on board). Wires 1105 that carry electrical current to the embedded electronics component 1102 from an electrical power source 1104 are embedded in a thermally conductive, electrically insulating plastic 1103. A main structure 1101 of the heat sink 1100 is made of thermally conductive, electrically non-insulating plastic that conducts heat away from the electronics component 1102 and the wires 1105. In one embodiment, the main structure 1101 of the heat sink 1100 is 3D printed directly onto the thermally conductive, electrically insulating plastic 1103 in which the wires 1105 are embedded. In one embodiment, the electrically insulating plastic 1103 in which the wires 1105 are embedded may act as an interfacial layer.

Figure 12:
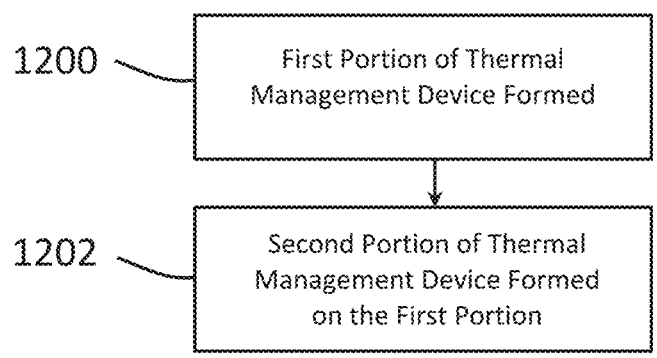
FIG. 12 shows a flowchart of one embodiment of a method of manufacturing a thermal management device.

FIG. 12 shows a flowchart of one embodiment of a method of manufacturing a thermal management device that includes a single contiguous component. The method may be performed to manufacture a thermal management device, as shown in one of FIGS. 1-11, or another thermal management device. The method is implemented in the order shown, but other orders may be used. Additional, different, or fewer acts may be provided.

In act 1200, a first portion of the thermal management device is formed. Forming the first portion includes three-dimensionally (3D) printing the first portion using a first thermally conductive plastic. In one embodiment, 3D printing the first portion using the first thermally conductive plastic includes 3D printing, by a first extruder, the first portion using the first thermally conductive plastic.

In act 1202, a second portion of the thermal management device is formed on the first portion. Forming the second portion includes 3D printing the second portion on the first portion using a second thermally conductive plastic. The second thermally conductive plastic is different than the first thermally conductive plastic. For example, the second thermally conductive plastic has a greater hardness than the first thermally conductive plastic. In one embodiment, 3D printing the second portion on the first portion using the second thermally conductive plastic includes 3D printing, by a second extruder, the second portion on the first portion using the second thermally conductive plastic. The second extruder is different than the first extruder.

In one embodiment, forming the first portion and forming the second portion are performed in a single manufacturing process. For example, the single manufacturing process may be 3D printing, for example, a heat sink. 3D printing the first portion includes 3D printing an interface of a heat sink using the first thermally conductive plastic, and 3D printing the second portion includes 3D printing a body and fins of the heat sink on the interface of the heat sink. In another embodiment, 3D printing the first portion includes fused deposition modeling the first portion, and 3D printing the second portion on the first portion includes fused deposition modeling the second portion on the first portion. Other additive manufacturing may be used. For example, 3D printing the first portion using the first thermally conductive plastic may include selective layer sintering with a first powder, and 3D printing the second portion using the second thermally conductive plastic may include selective layer sintering with a second powder.

The 3D printing of the method of FIG. 12 may be performed directly on components of a device to be cooled. For example, 3D printing the first portion includes 3D printing the first portion directly onto a circuit board supporting one or more heat generating components (e.g., processors, memory, circuits). As another example, 3D printing the first portion includes 3D printing the first portion directly onto a heat spreader.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a thermal management device includes a single contiguous component. The single contiguous component includes a first portion made of a first thermally conductive plastic and a second portion extending away from the first portion. The second portion is made of a second thermally conductive plastic. The second thermally conductive plastic is different than the first thermally conductive plastic.

In a second embodiment, with reference to the first embodiment, the first thermally conductive plastic is electrically insulating, and the second thermally conductive plastic is electrically non-insulating.

In a third embodiment, with reference to the second embodiment, the first thermally conductive plastic has a volume resistivity greater than $10^9$ Ω-cm and a thermal conductivity greater than 2.0 W/m-K. The second thermally conductive plastic has a volume resistivity less than $10^9$ Ω-cm and a thermal conductivity greater than 2.0 W/m-K.

In a fourth embodiment, with reference to the first embodiment, the first thermally conductive plastic has a thermal conductivity greater than 2.0 W/m-K, and the second thermally conductive plastic is a thermoplastic having a thermal conductivity less than 1.0 W/m-K.

In a fifth embodiment, with reference to the first embodiment, the first thermally conductive plastic includes a first polymer matrix, and the second thermally conductive plastic includes a second polymer matrix. The first polymer matrix and the second polymer matrix include a thermoplastic elastomer having different polymer chain lengths.

In a sixth embodiment, with reference to the fourth embodiment, the first thermally conductive plastic includes a first thermoplastic polymer and first filler particles, and the second thermally conductive plastic includes the first thermoplastic polymer and second filler particles. The second filler particles are different than the first filler particles.

In a seventh embodiment, with reference to the fourth embodiment, the first thermally conductive plastic includes a first thermoplastic polymer and a first weight percentage of first filler particles, and the second thermally conductive plastic includes the first thermoplastic polymer and a second weight percentage of second filler particles. The second weight percentage is different than the first weight percentage.

In an eighth embodiment, with reference to the first embodiment, the first thermally conductive plastic includes a first thermoplastic polymer, and the second thermally conductive plastic includes a second thermoplastic polymer. The second thermoplastic polymer is different than the first thermoplastic polymer.

In a ninth embodiment, with reference to the first embodiment, the first portion has a hardness of less than 95 A, and the second portion has a hardness of greater than 95 A.

In a tenth embodiment, with reference to the first embodiment, the first portion is a layer of material between 0.1 and 2.0 mm thick.

In an eleventh embodiment, with reference to the first embodiment, the single contiguous component further includes a third portion. The third portion is made of the first thermally conductive plastic or a third thermally conductive plastic. The third thermally conductive plastic is different than the first thermally conductive plastic and the second thermally conductive plastic.

In a twelfth embodiment, with reference to the eleventh embodiment, the first portion and the third portion each have a hardness of less than 95 A, and the second portion has a hardness of greater than 95 A.

In a thirteenth embodiment, with reference to the twelfth embodiment, the first portion extends a greater distance away from the surface of the second portion than the third portion.

In a fourteenth embodiment, with reference to the first embodiment, the thermal management device is a heat sink. The first portion is an interface attachable to a heat source of an electronic device. The second portion includes fins extending away from the first portion.

In a fifteenth embodiment, with reference to the first embodiment, the thermal management device is a battery housing. The first portion is a cylindrical interface configured to abut a battery supported by the battery housing. The second portion surrounds the first portion.

In a sixteenth embodiment, with reference to the fifteenth embodiment, the first thermally conductive plastic is electrically insulating, and the second thermally conductive plastic is electrically conductive.

In a seventeenth embodiment, with reference to the fifteenth embodiment, the second portion includes channels through which liquid is flowable.

In an eighteenth embodiment, with reference to the fifteenth embodiment, the cylindrical interface is 0.2 to 3.0 mm thick.

In a nineteenth embodiment, with reference to the fifteenth embodiment, the thermal management device further includes a third portion. The third portion is made of the first thermally conductive plastic or a third thermally conductive plastic. The third thermally conductive plastic is different than the first thermally conductive plastic and the second thermally conductive plastic. The third portion is spaced apart from the first portion. The second portion surrounds the third portion.

In a twentieth embodiment, with reference to the nineteenth embodiment, the first portion and the third portion each have a hardness of less than 95 A, and the second portion has a hardness of greater than 95 A.

In a twenty-first embodiment, with reference to the first embodiment, the thermal management device is a cold plate. The first portion is an interface attachable to a heat source of an electronic device. The second portion includes channels extending through the second portion.

In a twenty-second embodiment, with reference to the twenty-first embodiment, the single contiguous component further includes a third portion. The second portion is disposed between the first portion and the third portion. The first portion and the second portion have thermal conductivities greater than 2 W/m-K, respectively. The third portion has a thermal conductivity less than 1 W/m-K.

In a twenty-third embodiment, with reference to the first embodiment, the first thermally conductive plastic is transparent to electromagnetic waves over a range of frequencies, and the second thermally conductive plastic absorbs electromagnetic energy at a range of wavelengths.

In a twenty-fourth embodiment, with reference to the twenty-first embodiment, the first portion has a hardness of less than 95 A, and the second portion has a hardness of greater than 95 A.

In a twenty-fifth embodiment, an electronic device includes a heat generating component, and a heat sink that is a single contiguous component. The single contiguous component includes a first portion made of a first thermally conductive plastic. The first portion abuts the heat generating component. The single contiguous component also includes a second portion made of a second thermally conductive plastic and including fins extending away from the first portion. The second thermally conductive plastic is different than the first thermally conductive plastic.

In a twenty-sixth embodiment, with reference to the twenty-fifth embodiment, the electronic device further includes a circuit board supporting the heat generating component. The first portion surrounds the heat generating component, such that the first portion also abuts the circuit board.

In a twenty-seventh embodiment, with reference to the twenty-fifth embodiment, the heat generating component is a first heat generating component. The electronic device further includes a second heat generating component, and a circuit board that supports the first heat generating component and the second heat generating component. The single contiguous component further includes a third portion. The third portion is made of the first thermally conductive plastic and abuts the second heat generating component. The first portion and the third portion extend away from a surface of the second portion. The first heat generating component extends a greater distance away from the circuit board than the second heat generating component, such that the first portion extends a greater distance away from the surface of the second portion than the third portion extends away from the surface of the second portion.

In a twenty-eighth embodiment, with reference to the twenty-fifth embodiment, the electronic device further comprises a third portion covering at least part of the second portion. The third portion is made of a third thermally conductive plastic. The third thermally conductive plastic is different than the second thermally conductive plastic.

In a twenty-ninth embodiment, with reference to the twenty-eighth embodiment, the second thermally conductive plastic has a higher absorptivity than the third thermally conductive plastic in the solar spectrum.

In a thirtieth embodiment, with reference to the twenty-eighth embodiment, the third thermally conductive plastic has a higher emissivity than the second thermally conductive plastic in the infrared spectrum.

In a thirty-first embodiment, with reference to the twenty-fifth embodiment, the first portion has a hardness of less than 95 A, and the second portion has a hardness of greater than 95 A.

In a thirty-second embodiment, a method of manufacturing a thermal management device is provided. The thermal management device includes a single contiguous component. The method includes forming a first portion. The forming of the first portion includes three-dimensionally (3D) printing the first portion using a first thermally conductive plastic. The method also includes forming a second portion on the first portion. The forming of the second portion includes 3D printing the second portion on the first portion using a second thermally conductive plastic. The second thermally conductive plastic is different than the first thermally conductive plastic. The second portion has a greater hardness than the first portion.

In a thirty-third embodiment, with reference to the thirty-second embodiment, 3D printing the first portion using the first thermally conductive plastic includes 3D printing, by a first extruder, the first portion using the first thermally conductive plastic. 3D printing the second portion on the first portion using the second thermally conductive plastic includes 3D printing, by a second extruder, the second portion on the first portion using the second thermally conductive plastic.

In a thirty-fourth embodiment, with reference to the thirty-second embodiment, the forming of the first portion and the forming of the second portion are performed in a single manufacturing process.

In a thirty-fifth embodiment, with reference to the thirty-second embodiment, 3D printing the first portion includes 3D printing an interface of a heat sink using the first thermally conductive plastic. 3D printing the second portion includes 3D printing a body and fins of the heat sink on the interface of the heat sink.

In a thirty-sixth embodiment, with reference to the thirty-second embodiment, 3D printing the first portion includes fused deposition modeling the first portion. 3D printing the second portion on the first portion includes fused deposition modeling the second portion on the first portion.

In a thirty-seventh embodiment, with reference to the thirty-second embodiment, 3D printing the first portion includes 3D printing the first portion directly onto a circuit board supporting a heat generating component.

In a thirty-eighth embodiment, with reference to the thirty-second embodiment, 3D printing the first portion comprises 3D printing the first portion directly onto a heat spreader.

In a thirty-ninth embodiment, with reference to the thirty-second embodiment, 3D printing the first portion using the first thermally conductive plastic includes selective layer sintering with a first powder. 3D printing the second portion using the second thermally conductive plastic includes selective layer sintering with a second powder.

In a fortieth embodiment, with reference to the first embodiment, the first thermally conductive plastic has a dielectric constant below 5, and the second thermally conductive plastic has a dielectric constant above 7.

In a forty-first embodiment, with reference to the first embodiment, the first thermally conductive plastic has EMI/RFI shielding properties, and the second thermally conductive plastic is not operable to shield EMI/RFI signals.

In a forty-second embodiment, with reference to the first embodiment, the second thermally conductive plastic is UV stabilized, and the first thermally conductive plastic is not UV stabilized. For example, outer regions (e.g., outer layers or an outer cover) of the thermal management device are UV stabilized, and inner regions of the thermal management device are not UV stabilized.

In a forth-third embodiment, with reference to the first embodiment, the first thermally conductive plastic has high emissivity in the infrared, and the second thermally conductive plastic has low emissivity in the infrared.

In a forty-fourth embodiment, with reference to the nineteenth embodiment, the thermal management device further includes a third portion. The second portion is disposed between the first portion and the third portion. The first portion and the second portion have thermal conductivities greater than 2 W/m-K, respectively. The third portion has a thermal conductivity less than 1 W/m-K.

In connection with any one of the aforementioned embodiments, the thermal management device, the electronic device, or the method for manufacturing the thermal management device, may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A thermal management device comprising:
a single contiguous component comprising:
a first portion made of a first thermally conductive plastic; and
a second portion extending away from the first portion, the second portion being made of a second thermally conductive plastic, the second thermally conductive plastic being different than the first thermally conductive plastic,
wherein the second portion has a greater hardness than the first portion,
wherein the thermal management device is a battery housing, and
wherein the first portion is a cylindrical interface configured to abut a battery supported by the battery housing, and
wherein the second portion surrounds the first portion.

2. The thermal management device of claim 1, wherein the first thermally conductive plastic is electrically insulating, and the second thermally conductive plastic is electrically non-insulating.

3. The thermal management device of claim 1, wherein the first thermally conductive plastic includes a first polymer matrix, and the second thermally conductive plastic includes a second polymer matrix, the first polymer matrix and the second polymer matrix including a thermoplastic elastomer having different polymer chain lengths.

4. The thermal management device of claim 1, wherein the first thermally conductive plastic includes a first thermoplastic polymer and first filler particles, and the second thermally conductive plastic includes the first thermoplastic polymer and second filler particles, the second filler particles being different than the first filler particles.

5. The thermal management device of claim 1, wherein the first thermally conductive plastic includes a first thermoplastic polymer and a first weight percentage of first filler particles, and the second thermally conductive plastic includes the first thermoplastic polymer and a second weight percentage of second filler particles, the second weight percentage being different than the first weight percentage.

6. The thermal management device of claim 1, wherein the first thermally conductive plastic includes a first thermoplastic polymer, and the second thermally conductive plastic includes a second thermoplastic polymer, the second thermoplastic polymer being different than the first thermoplastic polymer,
wherein the first thermoplastic polymer of the first thermally conductive plastic is adhered to the second thermoplastic polymer of the second thermally conductive plastic,
wherein the first thermally conductive plastic includes first fillers, and the second thermally conductive plastic includes the first fillers at a different weight percentage than the first thermally conductive plastic, or includes second fillers, the second fillers being different than the first fillers, and
wherein one or more electrical properties, one or more thermal properties, one or more mechanical properties, or any combination thereof of the first thermally conductive plastic is different than one or more electrical properties, one or more thermal properties, one or more mechanical properties, or any combination thereof of the second thermally conductive plastic.

7. The thermal management device of claim 1, wherein the first portion has a hardness of less than 95 A, and the second portion has a hardness of greater than 95 A.

8. The thermal management device of claim 1, wherein the second portion includes channels through which liquid is flowable.

9. The thermal management device of claim 1, wherein the thermal management device is a cold plate,
   wherein the first portion is an interface attachable to a heat source of an electronic device, and
   wherein the second portion includes channels extending through the second portion.

10. An electronic device comprising:
   a heat generating component; and
   a heat sink that is a single contiguous component, the single contiguous component comprising:
      a first portion made of a first thermally conductive plastic, the first portion abutting the heat generating component; and
      a second portion made of a second thermally conductive plastic and including fins extending away from the first portion, the second thermally conductive plastic being different than the first thermally conductive plastic,
   wherein the first thermally conductive plastic includes a first thermoplastic polymer, and the second thermally conductive plastic includes a second thermoplastic polymer, the second thermoplastic polymer being different than the first thermoplastic polymer,
   wherein the first thermoplastic polymer of the first thermally conductive plastic is adhered to the second thermoplastic polymer of the second thermally conductive plastic,
   wherein the first thermally conductive plastic includes first fillers, and the second thermally conductive plastic includes the first fillers at a different weight percentage than the first thermally conductive plastic, or includes second fillers, the second fillers being different than the first fillers, and
   wherein one or more electrical properties, one or more thermal properties, one or more mechanical properties, or any combination thereof of the first thermally conductive plastic is different than one or more electrical properties, one or more thermal properties, one or more mechanical properties, or any combination thereof of the second thermally conductive plastic.

11. The electronic device of claim 10, further comprising a circuit board supporting the heat generating component,
   wherein the first portion surrounds the heat generating component, such that the first portion also abuts the circuit board.

12. The electronic device of claim 10, wherein the heat generating component is a first heat generating component,
   wherein the electronic device further comprises:
      a second heat generating component; and
      a circuit board that supports the first heat generating component and the second heat generating component,
   wherein the single contiguous component further comprises a third portion, the third portion being made of the first thermally conductive plastic and abutting the second heat generating component,
   wherein the first portion and the third portion extend away from a surface of the second portion, the first heat generating component extending a greater distance away from the circuit board than the second heat generating component, such that the third portion extends a greater distance away from the surface of the second portion than the first portion extends away from the surface of the second portion.

13. The electronic device of claim 10, further comprising a third portion covering at least part of the second portion, the third portion being made of a third thermally conductive plastic, the third thermally conductive plastic being different than the second thermally conductive plastic.

14. The electronic device of claim 13, wherein the second thermally conductive plastic has a higher absorptivity than the third thermally conductive plastic in the solar spectrum.

15. The electronic device of claim 13, wherein the third thermally conductive plastic has a higher emissivity than the second thermally conductive plastic in the infrared spectrum.

16. The electronic device of claim 10, wherein the first portion has a hardness of less than 95 A, and the second portion has a hardness of greater than 95 A.

* * * * *